US011656287B2

(12) United States Patent
Moon et al.

(10) Patent No.: US 11,656,287 B2
(45) Date of Patent: May 23, 2023

(54) BATTERY DEFECT SCREENING DEVICE AND METHOD

(71) Applicant: Samsung SDI Co., Ltd., Yongin-si (KR)

(72) Inventors: Se Hwan Moon, Yongin-si (KR); Joo Young Go, Yongin-si (KR); Tae Ho Kwon, Yongin-si (KR); Jae Kyung Kim, Yongin-si (KR); Hyung Sik Kim, Yongin-si (KR); Jae Seung Shin, Yongin-si (KR); Jeong Won Oh, Yongin-si (KR); Man Sang Yoon, Yongin-si (KR); Hyung Chun Lee, Yongin-si (KR); Kyong Min Jin, Yongin-si (KR)

(73) Assignee: Samsung SDI Co., Ltd., Yongin-si (KR)

( * ) Notice: Subject to any disclaimer, the term of this patent is extended or adjusted under 35 U.S.C. 154(b) by 0 days.

(21) Appl. No.: 17/444,679

(22) Filed: Aug. 9, 2021

(65) Prior Publication Data
US 2022/0137150 A1 May 5, 2022

(30) Foreign Application Priority Data

Nov. 5, 2020 (KR) .......................... 10-2020-0147038
Feb. 9, 2021 (KR) .......................... 10-2021-0018303

(51) Int. Cl.
*G01R 31/3842* (2019.01)
*G01R 31/396* (2019.01)
(Continued)

(52) U.S. Cl.
CPC ....... *G01R 31/3842* (2019.01); *G01R 31/396* (2019.01); *H02J 7/0047* (2013.01); *G01R 31/389* (2019.01)

(58) Field of Classification Search
None
See application file for complete search history.

(56) References Cited

U.S. PATENT DOCUMENTS 10,302,703 B2  5/2019  Fleischer et al.
11,193,980 B2  12/2021 Kobayashi et al.
(Continued)

FOREIGN PATENT DOCUMENTS

EP  3 320 355 A1  5/2018
EP  3 517 986 A2  7/2019
(Continued)

OTHER PUBLICATIONS

European Search Report, EP Application No. 21206309.3, dated Apr. 8, 2022, 5 pages.

*Primary Examiner* — Jas A Sanghera
(74) *Attorney, Agent, or Firm* — Lewis Roca Rothgerber Christie LLP

(57) ABSTRACT

A battery defect screening device including a battery fixer for fixing a battery, a discharger, a charger, a voltmeter for measuring an initial voltage value, a first voltage value, and a second voltage value, and a defect screener for determining the battery to be normal when a first voltage change value, which is obtained by subtracting the first voltage value from the initial voltage value, is less than a first reference value, to have a hard short due to the foreign material when the first voltage change value is greater than the first reference value, to be normal when a second voltage change value, which is obtained by subtracting the second voltage value from the initial voltage value, is less than a second reference value, and to have a soft short due to the foreign material when the second voltage change value is greater than the second reference value.

20 Claims, 5 Drawing Sheets

(51) Int. Cl.
*H02J 7/00* (2006.01)
*G01R 31/389* (2019.01)

(56) References Cited

U.S. PATENT DOCUMENTS

| 2014/0123472 | A1* | 5/2014 | Iwase | H01M 10/0468 |
| | | | | 29/593 |
| 2018/0196107 | A1 | 7/2018 | Fleischer et al. | |
| 2019/0198942 | A1 | 6/2019 | Kobayashi et al. | |
| 2019/0271746 | A1 | 9/2019 | Kim et al. | |

FOREIGN PATENT DOCUMENTS

| JP | 2002-352864 A | 12/2002 |
| WO | WO 2017/006319 A1 | 1/2017 |

\* cited by examiner

BATTERY DEFECT SCREENING DEVICE AND METHOD

CROSS-REFERENCE TO RELATED APPLICATION

This application claims priority to, and the benefit of, Korean Patent Application No. 10-2020-0147038 filed on Nov. 5, 2020 in the Korean Intellectual Property Office, and Korean Patent Application No. 10-2021-0018303 filed on Feb. 9, 2021 in the Korean Intellectual Property Office, the contents of which in its entirety are herein incorporated by reference.

BACKGROUND

1. Field

The present disclosure relates to a battery defect screening device and method.

2. Description of the Related Art

Rechargeable batteries (also called secondary batteries or battery cells) can be classified into, for example, prismatic types, cylindrical type, and pouch types, depending on configurations thereof. A prismatic or cylindrical battery may be manufactured by inserting an electrode assembly (or an electrode group) including a positive electrode, a separator, and a negative electrode in a metal can, and by sealing thereafter, while a pouch type battery may be manufactured by wrapping an electrode assembly with an aluminum foil coated with an insulator.

Meanwhile, as a battery cell is repeatedly charged and discharged, a cell thickness (or volume) may naturally increase, which is generally referred to as swelling. In general, to prevent the appearance of a battery module or pack from being deformed due to swelling when batteries are assembled into the module or pack, the battery appearance is finished with an end plate and a side plate, etc. That is, a large number of batteries are fixed to reduce or prevent swelling of the batteries within a space defined by the end plate and the side.

Accordingly, in a case where a foreign material (e.g., conductive particles) is introduced to an electrode assembly, can, or pouch during the manufacture of a battery, the thickness of an electrode assembly located inside a battery may be increased (e.g., the thickness of a negative electrode active material may be increased) during charging and discharging of the battery in a state in which the outer surface of the battery is fixed. Eventually, the foreign material may cause a damage to (or may pierce) a separator or an insulation film, thereby causing an electrical short-circuit between the positive electrode and the negative electrode.

The above information disclosed in this Background section is only for enhancement of understanding of the background of embodiments of the present disclosure, and therefore may contain information that does not constitute prior art.

SUMMARY

The present disclosure provides a battery defect screening device and method for screening a potential defect in a battery during or after the manufacture of the battery. The present disclosure provides a battery defect screening device and method for screening a defect in a battery mounted in a battery cell, a battery module, a battery pack, or a vehicle. In addition, the present disclosure provides a battery defect screening device and method for screening a defect in a battery within a short period of time.

A battery defect screening device according to some embodiments of the present disclosure may include a battery fixer for fixing a secondary battery, a discharger for discharging the secondary battery, a charger for charging the secondary battery, a voltmeter for measuring an initial voltage value after charging the secondary battery, for measuring a first voltage value after a first time period, and for measuring a second voltage value after a second time period, and a defect screener for determining the secondary battery to be a normal battery that is without a foreign material when a first voltage change value, which is obtained by subtracting the first voltage value from the initial voltage value, is less than a first reference value, determining the secondary battery to be a defective battery having a hard short due to the foreign material when the first voltage change value is greater than the first reference value, determining the secondary battery to be a normal battery that is without a foreign material when a second voltage change value, which is obtained by subtracting the second voltage value from the initial voltage value, is less than a second reference value, and determining the secondary battery to be a defective battery having a soft short due to the foreign material when the second voltage change value is greater than the second reference value.

The battery defect screening device may further include an ammeter for measuring a current of the secondary battery, wherein, before measuring the initial voltage value of the secondary battery after charging the secondary battery, the defect screener is configured to repeatedly charge and discharge the secondary battery by means of the charger and the discharger, calculate a voltage change value (dV) using a voltage value input from the voltmeter, calculate a storage capacity (Q) using a current value input from the ammeter, calculate a storage capacity change value (dQ) based on the storage capacity (Q), and determine the secondary battery to be a defective battery having a hard short due to the foreign material when a voltage change value divided by storage capacity change value (dV/dQ) is less than 0.

The secondary battery may be determined to be a normal battery when the voltage change value divided by the storage capacity change value (dV/dQ) is greater than 0.

The battery fixer may be configured to fix exterior sides of the secondary battery so as to reduce or prevent change of an outer thickness of the secondary battery due to charging or discharging of the secondary battery.

The discharger may be configured to discharge the secondary battery to a voltage that is lower than a full discharge voltage of the secondary battery.

The charger may be configured to charge the secondary battery to a voltage that is lower than a full charge voltage set to the secondary battery.

The second time period may be longer than the first time period.

The charger and the discharger may be configured to have a rest time after the initial voltage value of the secondary battery is measured.

The second reference value may be less than the first reference value.

The battery defect screening device may further include a display configured to indicate a normal battery, a defective battery having a hard short, or a defective battery having a soft short.

A battery defect screening method according to some embodiments of the present disclosure may include fixing a secondary battery, discharging the secondary battery, charging the secondary battery, measuring an initial voltage value after charging the secondary battery, measuring a first voltage value after a first time period, measuring a second voltage value after a second time period, and determining the secondary battery to be a normal battery without a foreign material when a first voltage change value, which is obtained by subtracting the first voltage value from the initial voltage value, is less than a first reference value, a defective battery having a hard short due to the foreign material when a second voltage change value, which is obtained by subtracting the second voltage value from the initial voltage value, is less than a second reference value, or a defective battery having a soft short due to the foreign material when the second voltage change value is greater than the second reference value.

The battery defect screening method may further include performing a current measurement operation of measuring a current of the secondary battery, repeatedly charging and discharging the secondary battery, calculating a voltage change value (dV) using voltage values input from a voltmeter, calculating a storage capacity (Q) using a current value input from an ammeter, calculating a storage capacity change value (dQ) based on the storage capacity (Q), and determining the secondary battery to be a defective battery when a voltage change value divided by a storage capacity change value (dV/dQ) is less than 0.

The battery defect screening method may further include determining the secondary battery to be a normal battery when the voltage change value divided by the storage capacity change value (dV/dQ) is greater than 0.

Fixing the secondary battery may include fixing exterior sides of the secondary battery so as to reduce or prevent change of an outer thickness of the secondary battery during charging or discharging of the secondary battery.

Discharging the secondary battery may include discharging the secondary battery to a voltage that is lower than a full discharge voltage of the secondary battery.

Charging the secondary battery may include charging the secondary battery to a voltage that is lower than a full charge voltage of the secondary battery.

The second time period may be longer than the first time period.

The battery defect screening method may further include providing a rest time after measuring the initial voltage value of the secondary battery.

The second reference value may be less than the first reference value.

The battery defect screening method may further include indicating on a display a normal battery, a defective battery having a hard short, or a defective battery having a soft short.

As described above, the present disclosure provides a battery defect screening device and method for screening a potential defect in a battery during or after the manufacture of the battery. In some embodiments, the present disclosure provides a battery defect screening device and method for screening a defect in a battery mounted in a battery cell, a battery module, a battery pack, or a vehicle. In addition, the present disclosure provides a battery defect screening device and method for screening a defect in a battery within a short period of time.

DETAILED DESCRIPTION

Figure 1:
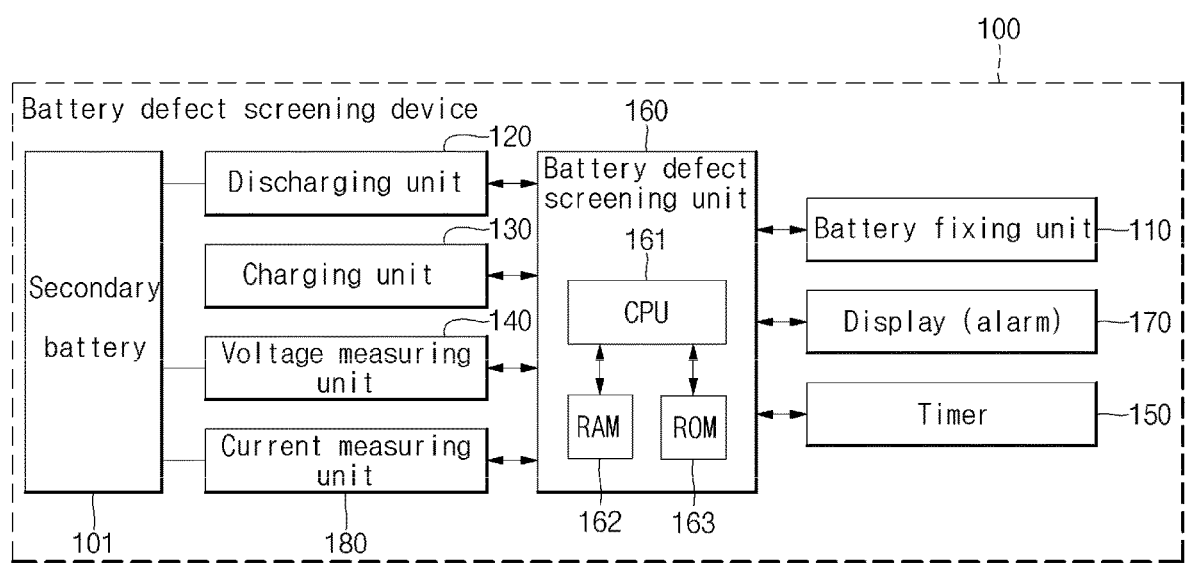
FIG. 1 is a block diagram illustrating a configuration of a battery defect screening device according to some embodiments of the present disclosure.

Aspects of some embodiments of the present disclosure and methods of accomplishing the same may be understood more readily by reference to the detailed description of embodiments and the accompanying drawings. Hereinafter, embodiments will be described in more detail with reference to the accompanying drawings. The described embodiments, however, may be embodied in various different forms, and should not be construed as being limited to only the illustrated embodiments herein. Rather, these embodiments are provided as examples so that this disclosure will be thorough and complete, and will fully convey the aspects of the present disclosure to those skilled in the art. Accordingly, processes, elements, and techniques that are not necessary to those having ordinary skill in the art for a complete understanding of the aspects of the present disclosure may not be described.

Unless otherwise noted, like reference numerals, characters, or combinations thereof denote like elements throughout the attached drawings and the written description, and thus, descriptions thereof will not be repeated. Further, parts not related to the description of the embodiments might not be shown to make the description clear.

In the drawings, the relative sizes of elements, layers, and regions may be exaggerated for clarity. Additionally, the use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Also, variations from the shapes of the illustrations, as well as manufacturing techniques and/or tolerances, are to be expected. Further, specific structural or functional descriptions disclosed herein are merely illustrative for the purpose of describing embodiments according to the concept of the present disclosure. Thus, embodiments disclosed herein should not be construed as limited to the particular illustrated shapes of regions, but are to include deviations in shapes that result from, for instance, manufacturing.

Thus, the regions illustrated in the drawings are schematic in nature and their shapes are not intended to illustrate the actual shape of a region of a device and are not intended to be limiting. Additionally, as those skilled in the art would realize, the described embodiments may be modified in various different ways, all without departing from the spirit or scope of the present disclosure.

In the detailed description, for the purposes of explanation, numerous specific details are set forth to provide a thorough understanding of various embodiments. It is apparent, however, that various embodiments may be practiced without these specific details or with one or more equivalent arrangements. In other instances, well-known structures and devices are shown in block diagram form in order to avoid unnecessarily obscuring various embodiments.

Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. Similarly, when a first part is described as being arranged "on" a second part, this indicates that the first part is arranged at an upper side or a lower side of the second part without the limitation to the upper side thereof on the basis of the gravity direction.

It will be understood that when an element, layer, region, or component is referred to as being "formed on," "on," "connected to," or "coupled to" another element, layer, region, or component, it can be directly formed on, on, connected to, or coupled to the other element, layer, region, or component, or indirectly formed on, on, connected to, or coupled to the other element, layer, region, or component such that one or more intervening elements, layers, regions, or components may be present. For example, when a layer, region, or component is referred to as being "electrically connected" or "electrically coupled" to another layer, region, or component, it can be directly electrically connected or coupled to the other layer, region, and/or component or intervening layers, regions, or components may be present. However, "directly connected/directly coupled" refers to one component directly connecting or coupling another component without an intermediate component. Meanwhile, other expressions describing relationships between components such as "between," "immediately between" or "adjacent to" and "directly adjacent to" may be construed similarly. In addition, it will also be understood that when an element or layer is referred to as being "between" two elements or layers, it can be the only element or layer between the two elements or layers, or one or more intervening elements or layers may also be present.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure. The description of an element as a "first" element may not require or imply the presence of a second element or other elements. The terms "first", "second", etc. may also be used herein to differentiate different categories or sets of elements. For conciseness, the terms "first", "second", etc. may represent "first-category (or first-set)", "second-category (or second-set)", etc., respectively.

The terminology used herein is for the purpose of describing particular embodiments only and is not intended to be limiting of the present disclosure. As used herein, the singular forms "a" and "an" are intended to include the plural forms as well, unless the context clearly indicates otherwise. It will be further understood that the terms "comprises," "comprising," "have," "having," "includes," and "including," when used in this specification, specify the presence of the stated features, integers, steps, operations, elements, and/or components, but do not preclude the presence or addition of one or more other features, integers, steps, operations, elements, components, and/or groups thereof.

As used herein, the term "substantially," "about," "approximately," and similar terms are used as terms of approximation and not as terms of degree, and are intended to account for the inherent deviations in measured or calculated values that would be recognized by those of ordinary skill in the art. "About" or "approximately," as used herein, is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value. Further, the use of "may" when describing embodiments of the present disclosure refers to "one or more embodiments of the present disclosure."

When one or more embodiments may be implemented differently, a specific process order may be performed differently from the described order. For example, two consecutively described processes may be performed substantially at the same time or performed in an order opposite to the described order.

Also, any numerical range disclosed and/or recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein, and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein. All such ranges are intended to be inherently described in this specification such that amending to expressly recite any such subranges would comply with the requirements of 35 U.S.C. § 112(a) and 35 U.S.C. § 132(a).

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

In addition, a defect screening unit (control unit or controller) according to some embodiments of the present disclosure and/or other related devices or parts may be implemented using arbitrary appropriate hardware, firmware (e.g., an on-demand semiconductor), software, or an appropriate combination of firmware and hardware. For example, the defect screening unit (control unit or controller) according to some embodiments of the present disclosure and/or various components of other related devices or parts may be formed on an integrated circuit chip or on a separate integrated circuit chip. In addition, the various components of the defect screening unit (control unit or controller) may be implemented on a flexible printed circuit film and may be formed on a tape carrier package, a printed circuit board, or the same substrate as that of the defect screening unit (control or controller). In addition, the various components of the defect screening unit control unit or controller) may be a process or thread running on one or more processors in one or more computing devices, which may execute computer program commands and interact with other components to perform various functions to be mentioned below. The computer program commands are stored in a memory that can be executed on a computing device using a standard memory device, such as a random access memory. The computer program commands may also be stored in other non-transitory computer readable media, such as CD-ROMs or flash drives. Furthermore, a person skilled in the art must recognize that functions of various computing devices may be interlinked or incorporated into one computing device, or functions of a particular computing device may be dispersed to one or more other computing devices without deviating from embodiments of the present disclosure.

FIG. 1 is a block diagram illustrating a configuration of a battery defect screening device 100 according to some embodiments of the present disclosure. As shown in FIG. 1, the battery defect screening device 100 may include a battery fixing unit (e.g., a battery fixer) 110, a discharging unit (e.g., a discharger) 120, a charging unit (e.g., a charger) 130, a voltage measuring unit (e.g., a voltmeter) 140, a timer 150, a battery defect screening unit (e.g., a battery defect screener) 160, and a display unit (e.g., a display) 170. In some embodiments, the battery defect screening device 100 may further include a current measuring unit (e.g., an ammeter) 180.

Figure 3:
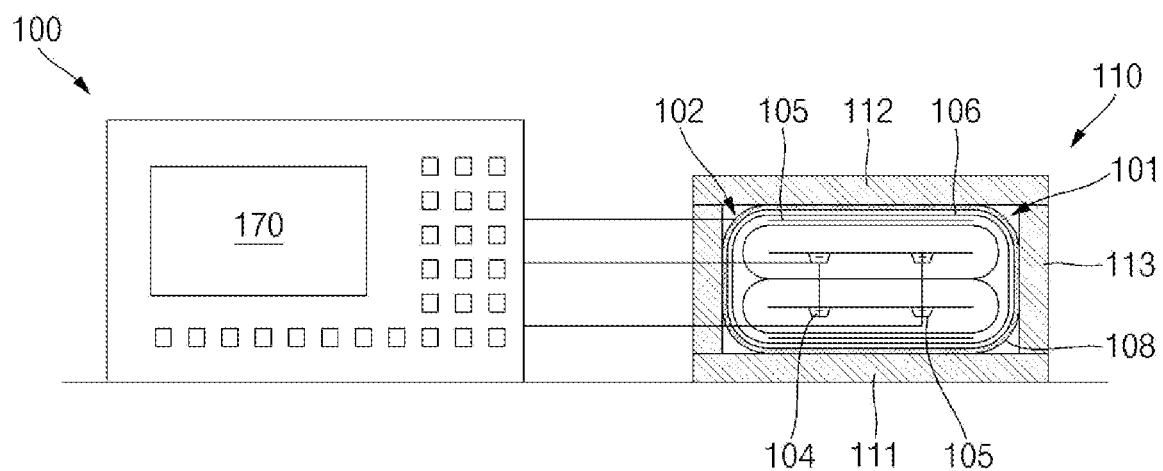
FIG. 3 is a schematic diagram illustrating an electrical connection between a battery defect screening device and a battery fixed inside a battery fixer, according to some embodiments of the present disclosure.

The battery fixer 110 may mechanically fix (e.g., may affix) a secondary battery 101. In some embodiments, the battery fixer 110 is mechanically brought into close contact with the outer surface of the secondary battery 101 to reduce or prevent a change in the outer thickness or volume of the secondary battery 101 due to swelling during charging and discharging of the secondary battery 101. In some embodiments, there is no change in the outer thickness or volume of the secondary battery 101 by means of the battery fixer 110, but the internal thickness of the secondary battery 101 may be increased (e.g., the thickness of the electrode assembly may be increased). In some embodiments, the battery fixer 110 may compress long side portions of the secondary battery 101. In some embodiments, as shown in FIG. 3, the battery fixer 110 may include a bottom plate 111 and a top plate 112 in pair for closely contacting the long side portions of the secondary battery 101, and a pair of side plates 113 to be located at short side portions of the secondary battery 101 and connecting the bottom plate 111 with the top plate 112 (see FIG. 3). In some embodiments, the battery fixer 110 may include variable side plates that are moved by hydraulic cylinders or pneumatic cylinders.

The discharger 120 may be electrically connected to the secondary battery 101, and may forcibly discharge (e.g., instead of naturally discharge) the secondary battery 101. In some embodiments, the secondary battery 101 may be connected to a discharge load of the discharger 120, and may be forcibly discharged to a discharge reference voltage. In some embodiments, the discharge reference voltage may be lower than a full discharge voltage set to the secondary battery 101. In some embodiments, if the full discharge voltage of the secondary battery 101 is set to approximately 3.2 V, the discharge reference voltage may be approximately 3.0 V, which is lower than the full discharge voltage.

The charger 130 may be electrically connected to the secondary battery 101, and may charge the secondary battery 101. In some embodiments, the secondary battery 101 may be connected to a charging device of the charger 130, and may charge the secondary battery 101 to a charge reference voltage. In some embodiments, the charge reference voltage may be higher than a full charge voltage set to the secondary battery 101. In some embodiments, if the full charge voltage of the secondary battery 101 is set to approximately 4.0 V, the charge reference voltage may be approximately 4.3 V, which is higher than the full charge voltage.

The voltmeter 140 may be electrically connected to the secondary battery 101, and may measure an initial voltage value V0 after charging the secondary battery 101 to then transmit the initial voltage value V0 to the battery defect screener 160. The voltmeter 140 may also measure a first voltage value V1 after the lapse of a first time period, and may then transmit the first voltage value V1 to the battery defect screener 160. The voltmeter 140 may also measure a second voltage value V2 after the lapse of a second time period, and may then transmit the second voltage value V2 to the battery defect screener 160. In some embodiments, a rest time may be additionally provided after measuring the initial voltage value of the secondary battery 101. In some embodiments, the first time period may be a time period after the rest time. In some embodiments, the second time period may be provided after the rest time. In some embodiments, the rest time may be longer than the first time period. In some embodiments, the second time period may be longer than the first time period.

The timer 150 may measure an elapsed time, and may provide the measured elapsed time to the battery defect screener 160. In some embodiments, the timer 150 may measure the rest time, the first time period, and the second time period, and may provide the same to the battery defect screener 160. In some embodiments, the timer 150 may include an integrated circuit chip containing a pulse generator or an oscillator.

The battery defect screener 160 may include a central processing unit (CPU) 161, a random access memory (RAM) 162, and a read only memory (ROM) 163. Algorithms, software or programs for implementing the battery defect screening method according to some embodiments of the present disclosure may be stored in the ROM, and various data, such as a rest time, a first reference value, a second reference value, etc. may also be stored in the ROM. Data, including a measured initial voltage value, a measured first voltage value, a measured secondary voltage value, and a measured current value, may be stored in the RAM. The CPU 161 may implement the battery defect screening method according to some embodiments of the present disclosure while exchanging the data with the discharger 120, the charger 130, the voltmeter 140, the ammeter 180, the display 170, and/or the timer 150. In some embodiments, when the battery fixer 110 is operated by a hydraulic cylinder or a pneumatic cylinder, the CPU 161 may control the operation of the battery fixer 110. In some embodiments, the voltmeter 140 and the ammeter 180 may be a voltage sensor and a current sensor, respectively, and may be provided in a battery monitoring system (BMS) of the secondary battery 101.

In some embodiments, the battery defect screener 160 may determine the battery to be a normal battery that is without a foreign material when a first voltage change value (dV=V0−V1), which may be obtained by subtracting the first voltage value from the initial voltage value, is less than the first reference value. In some embodiments, the battery defect screener 160 may determine the battery to be a defective battery having a hard short due to a foreign material when the first voltage change value (dV=V0−V1), which may be obtained by subtracting the first voltage value from the initial voltage value, is greater than the first reference value. In some embodiments, the battery defect screener 160 may determine the battery to be a normal battery that is without a foreign material when a second voltage change value (dV=V0−V2), which may be obtained by subtracting the second voltage value from the initial voltage value, is less than the second reference value. In some embodiments, the battery defect screener 160 may determine the battery to be a defective battery having a soft short due to a foreign material when the second voltage change value (dV=V0−V2), which may be obtained by subtracting the second voltage value from the initial voltage value, is greater than the second reference value.

In some embodiments, the first reference value may be set to be greater (or higher) than the second reference value. Therefore, the first reference value may become a reference for the internal hard short of the secondary battery 101, and the second reference value may become a reference for the internal soft short of the secondary battery 101. In some embodiments, the hard short may correspond to a case in which a fire may occur to a secondary battery due to an internal short, and the soft short may correspond to a case in which a voltage of a secondary battery may be reduced due to an internal short. In some embodiments, a secondary battery having a hard short cannot be used in a module or pack, while a secondary battery having a soft short can be used in a module or pack.

The display 170 may receive data from the battery defect screener 160, and may allow an operator to display a normal battery, a defective battery having a hard short, or a defective battery having a soft short.

Meanwhile, the ammeter 180 may continuously measure current levels of the secondary battery 101 during charging and discharging of the secondary battery 101 and may provide the measured current levels to the battery defect screener 160. Accordingly, the battery defect screener 160 may additionally determine whether the battery is defective or not, by dividing the voltage change value by the storage capacity change value (dV/dQ). In some embodiments, the battery defect screener 160 may repeatedly charge and discharge the secondary battery 101 approximately two to ten times by means of the charger 130 and the discharger 120, before measuring an initial voltage value after charging the secondary battery 101. Here, the battery defect screener 160 may calculate the voltage change value (dV) using the voltage values input from the voltmeter 140, and may calculate a storage capacity (Q) using the current values input from the ammeter 180. In some embodiments, the battery defect screener 160 may calculate the storage capacity change value (dQ) based on the storage capacity (Q). Finally, the battery defect screener 160 may determine the battery to be a defective battery having a hard short due to a foreign material when the voltage change value/the storage capacity change value (dV/dQ) is less than 0. Of course, the battery defect screener 160 may determine the battery to be a normal battery when the voltage change value/the storage capacity change value (dV/dQ) is greater than 0. In some embodiments, the voltage change value and the storage capacity change value may mean values changing over time. In some embodiments, the time may mean microseconds, milliseconds, or seconds. In some embodiments, the voltage change value/the storage capacity change value (dV/dQ) may also be referred to as a differential voltage.

In some embodiments, it will be understood that when the voltage change value/the storage capacity change value (dV/dQ) is referred to as being less than 0, the voltage and/or the storage capacity may be reduced even if charging of the secondary battery is continued, and when the voltage change value/the storage capacity change value (dV/dQ) is referred to as being greater than 0, the voltage and/or the storage capacity may be increased as charging of the secondary battery is continued.

Figure 2:
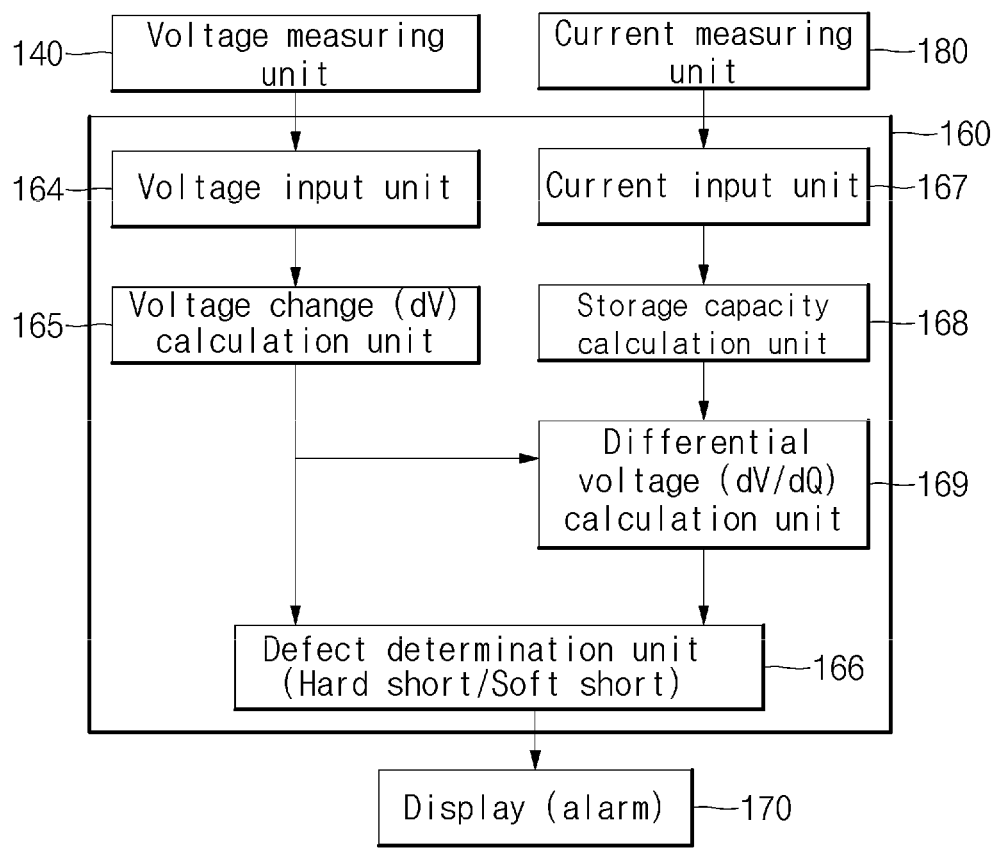
FIG. 2 is a block diagram illustrating a configuration of a battery defect screener in the battery defect screening device according to some embodiments of the present disclosure.

FIG. 2 is a block diagram illustrating a configuration of a battery defect screener in the battery defect screening device according to some embodiments the present disclosure. As shown in FIG. 2, the battery defect screener 160 may include a voltage input unit 164, a voltage change calculation unit (e.g., a voltage change calculator) 165, and a defect determination unit (e.g., a defect determiner) 166. In some embodiments, the battery defect screener 160 may further include a current input unit 167, a storage capacity calculation unit (e.g., a storage capacity calculator) 168, and a differential voltage calculation unit (e.g., differential voltage calculator) 169.

In some embodiments, the voltage change calculator 165 may calculate a first voltage change value by subtracting, from an initially measured voltage (V0), a first voltage (V1) measured after the lapse of the rest time and the first time period after charging of the secondary battery 101 is completed, and may transmit the resulting value to the defect determiner 166. In addition, the voltage change calculator 165 may calculate a second voltage change value by subtracting, from the initially measured voltage (V0), a second voltage (V2) measured after the lapse of the second time period, and may transmit the resulting value to the defect determiner 166. Accordingly, the defect determiner 166 may compare the first voltage change value with a first reference value to determine whether the battery is defective or not (e.g., whether the battery has a hard short, or may compare the second voltage change value with a second reference value to determine whether the battery is defective or not (e.g., whether the battery has a soft short.

In some embodiments, the voltage change calculator 165 may provide the voltage change value (dV) while repeating charging and discharging operations multiple times before obtaining the initially measured value, as described above. In addition, the storage capacity calculator 168 may calculate the storage capacity (Q) using a current value input from the current input unit 167, and may transmit the result value to the differential voltage calculator 169. Accordingly, the differential voltage calculator 169 may calculate the storage capacity change value (dQ), may calculate the differential voltage (dV/dQ), and may transmit the result to the defect determiner 166. When the differential voltage (dV/dQ) is less than 0, the defect determiner 166 may immediately stop charging and discharging of the secondary battery 101 to then determine that a short circuit has occurred in the secondary battery 101, and when the differential voltage (dV/dQ) is greater than 0, the defect determiner 166 may determine that the secondary battery 101 is a normal battery to then repeat charging and discharging of the secondary battery 101 a predetermined number of times.

In this way, according to some embodiments of the present disclosure, it is possible to screen a battery whether the battery has an internal short having occurred during the repeated operations of charging and discharging of the battery, and it is also possible to screen a battery whether the battery has a hard short and/or a soft short after charging of the battery is completed. As described above, the battery defect screening may be achieved during or after the manufacturing process of the battery. In some embodiments, the present disclosure provides a battery defect screening device and method for screening a defect in a battery mounted in a battery cell, a battery module, a battery pack, or a vehicle.

FIG. 3 is a schematic diagram illustrating an electrical connection between a battery defect screening device and a battery fixed inside a battery fixer, according to some embodiments of the present disclosure.

As shown in FIG. 3, the battery fixer 110 may include a bottom plate 111, a top plate 112, and a side plate 113, and the secondary battery 101 may be positioned inside the battery fixer 110. Here, the bottom plate 111 and the top plate 112 are brought into close contact with bottom and top surfaces of the secondary battery 101, and thus the outer thickness or volume of the secondary battery 101 may not increase even if charging and discharging of the secondary battery 101 are repeated.

Figure 4A:
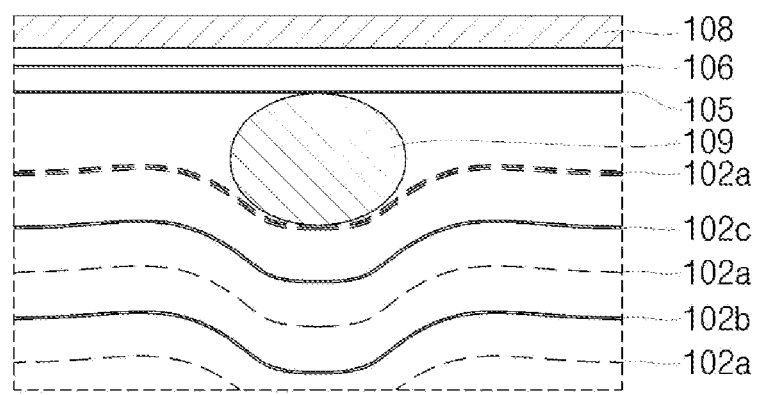
FIGS. 4A and 4B are schematic diagrams illustrating a state in which a foreign material is located inside a battery.
Figure 4B:
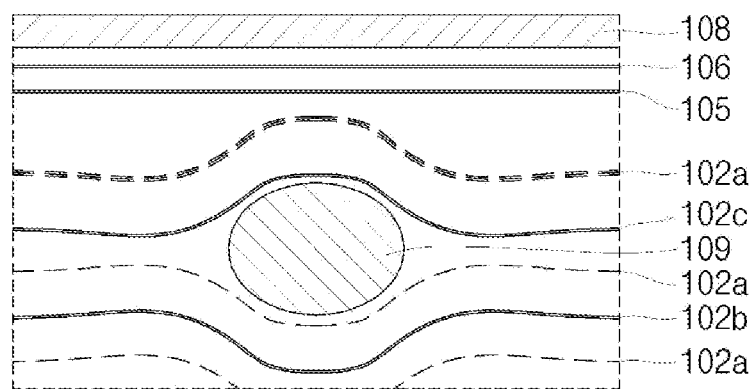

In some embodiments, as shown in FIGS. 4A and 4B, the secondary battery 101 may include an electrode assembly 102 wound or stacked in a state in which a positive electrode plate 102b, a separator 102a, and a negative electrode plate 102c are stacked, an insulation sheet 105 positioned on an exterior side of the electrode assembly 102, an enclosing tape 106 enclosing the electrode assembly 102, and a case 108 accommodating the electrode assembly 102. In some embodiments, at least one or two electrode assemblies 102 may be accommodated in the case 108. In addition, the electrode assembly 102 may be electrically connected to a positive electrode terminal 103 and a negative electrode terminal 104 exposed to the exterior side of the case 108. In some embodiments, the positive electrode terminal 103 may be electrically connected to the metal case 108, and thus the metal case 108 may be charged as a positive polarity.

In some embodiments, the battery defect screening device 100, which is electrically connected to the positive electrode terminal 103 and the negative electrode terminal 104 of the secondary battery 101, may perform charging and discharging of the secondary battery 101, and may measure voltages and currents of the secondary battery 101.

Although a prismatic battery is shown in FIG. 3, the present disclosure may also be applied to a cylindrical battery and/or to a pouch type battery in other embodiments.

In some embodiments, it is possible to screen whether a foreign material has been introduced into the electrode assembly before completing the secondary battery, for example, before the electrode assembly is accommodated in the case. In some embodiments, because the electrode assembly having yet to be accommodated in the case cannot be charged or discharged, and thus swelling does not occur. In such a case, the electrode assembly should be forcibly pressurized (e.g., with about 5 kN to about 25 kN) by accommodating the electrode assembly at an interior side of the case, and then pressurizing the bottom plate 111 or the top plate 112. In some embodiments, the battery defect screening device 100 may determine whether a foreign material has been introduced into the electrode assembly by measuring electrical resistance between the positive electrode terminal and the negative electrode terminal of the electrode assembly. In some embodiments, if the electrical resistance between the positive electrode terminal and the negative electrode terminal is less than a reference value (e.g., a predetermined reference value), it may be determined that a foreign material has been introduced into the electrode assembly. In other words, when the electrical resistance between the positive electrode terminal and the negative electrode terminal is referred to as being less than the reference value, it means that the positive electrode terminal and the negative electrode terminal of the electrode assembly are electrically shorted.

FIGS. 4A and 4B are schematic diagrams illustrating a state in which a foreign material is located inside a battery. As shown in FIG. 4A, a foreign material 109 (e.g., one or more conductive particles) may be located between the separator 102a positioned at the outermost portion of the electrode assembly 102 and the case 108, or, as shown in FIG. 4B, between the positive electrode plate 102b and the separator 102a. Therefore, if the internal thickness is increased in a state in which the case 108 of the secondary battery 101 is not deformed (e.g., if the thickness of a negative electrode active material is increased), the foreign material 109 penetrates the separator 102a to cause a short circuit between the case 108 and the positive electrode plate 102b, or a short circuit between the negative electrode plate 102c and the positive electrode plate 102b.

In some embodiments, a short causing a fire to occur due to the foreign material 109 may be referred to as a hard short, and a short causing the voltage of battery to be reduced due to the foreign material 109 may be referred to as a soft short. In the present disclosure, it is possible to accurately and easily screen not only whether a hard short defect, but also whether a soft short defect has occurred in the battery due to the foreign material 109.

Figure 5:
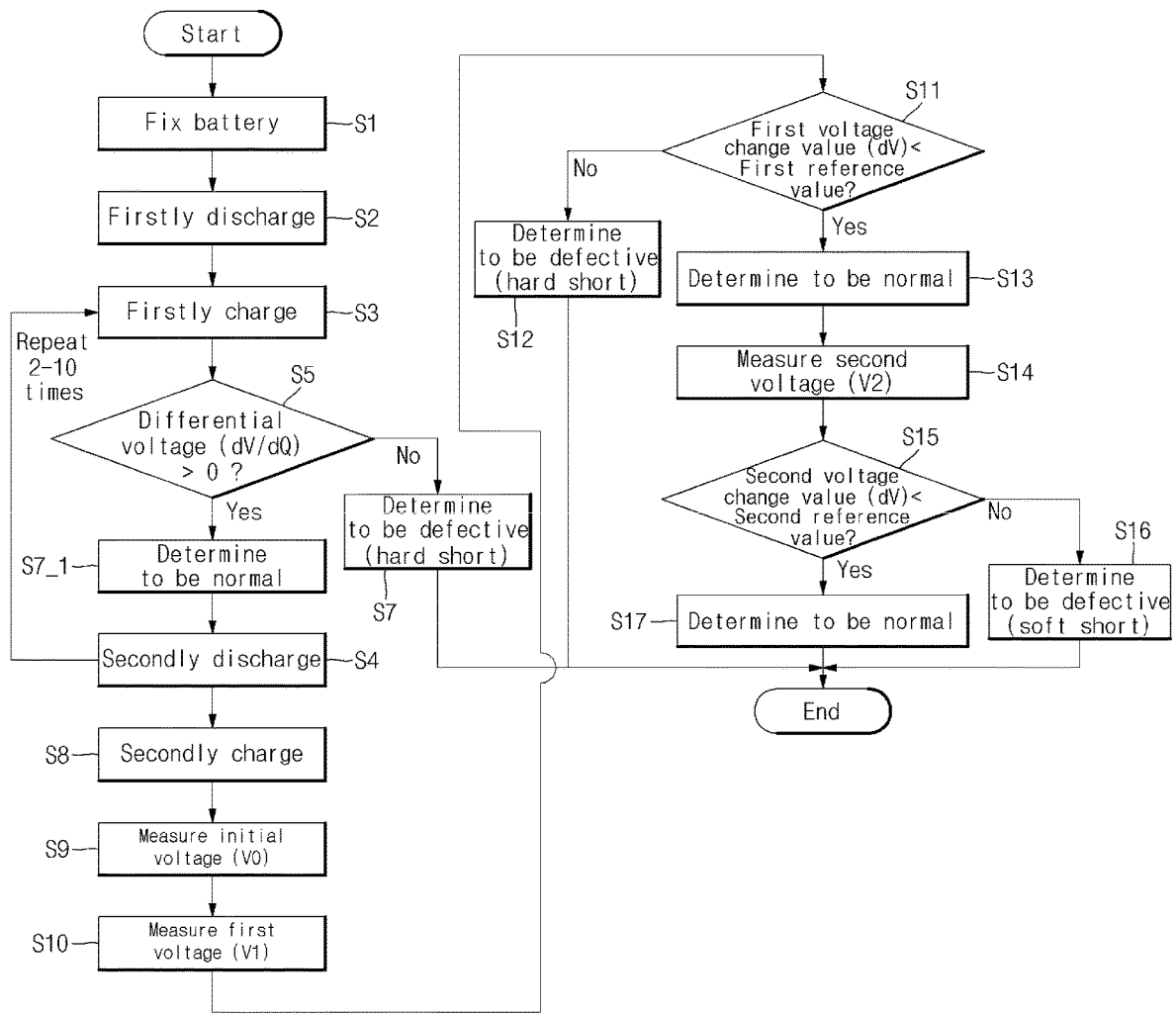
FIG. 5 is a flow chart illustrating a configuration of a battery defect screening method according to some embodiments of the present disclosure.

FIG. 5 is a flow chart illustrating a battery defect screening method according to some embodiments of the present disclosure. As shown in FIG. 5, the battery defect screening method may include a battery fixing operation (S1), discharging operations (S2 and S4), charging operations (S3 and S8), an initial voltage value measuring operation (S9), a first voltage value measuring operation (S10), first normal/defective battery determining operations (S11, S12 and S13), a second voltage value measuring operation (S14), and second normal/defective battery determining operations (S15, S16, and S17). In some embodiments, the battery defect screening method may further include normal/defective battery determining operations based on comparison of differential voltage values (S5, S7 and S7_1). In some embodiments, a controlling and/or determining subject may be the battery defect screener 160 shown in FIGS. 1 and 2.

In the battery fixing operation (S1), the rechargeable secondary battery 101 to be screened (to determine whether it is defective or not) may be automatically or manually fixed to the battery fixer 110 so as to reduce or prevent change of the outer thickness (or volume) of the battery during charging and discharging.

The discharging operations (S2 and S4) may include a first discharging operation (S2) and a second discharging operation (S4), and the charging operations (S3 and S8) may include a first charging operation (S3) and a second charging operation (S8). In general, the secondary battery 101 to be screened to determine whether it is defective or not is released to the market in a state in which the battery is charged to some extent (e.g., released with a SOC of about 20% to about 40%), and thus discharging to a voltage (e.g., about 3.0 V) that is lower than a set full discharge voltage may be performed by means of the discharger 120 in the first discharging operation (S2). Charging to a voltage (e.g., about 4.27 V) that is higher than a set full charge voltage may be performed by means of the charger 130 in the first charging operation (S3). In addition, discharging to a voltage that is lower than the set full discharge voltage may be performed by means of the discharger 120 in the second discharging operation (S4), and charging to a voltage that is higher than the set full charge voltage may be performed by means of the charger 130 in the second charging operation (S8). As described above, because the secondary battery 101 is discharged to a voltage that is lower than the full discharge voltage or charged to a voltage that is higher than the full charge voltage, the extent of swelling of the secondary battery 101 having undergone the charging and discharging operations according to some embodiments of the present disclosure may be relatively increased as compared to the extent of swelling of the secondary battery 101 having undergone general charging and discharging operations (that is, the outer thickness of the secondary battery 101 may not be increased but the internal thickness thereof may be relatively increased).

In some embodiments, the first charging operation (S3) and the second discharging operation (S4) may be repeated about 2 to about 10 times, thereby further increasing the swelling of the secondary battery 101, and further improving the defect screening accuracy due to the foreign material 109.

In some embodiments, when charging and discharging operations are repeated, the battery defect screening method may further include the normal/defective battery determining operations based on a comparison of differential voltage values (S5, S7 and S7_1). In some embodiments, the battery defect screener 160 may calculate the voltage change value (dV) using the voltage values input from the voltmeter 140, and may calculate a storage capacity (Q) using the current value input from the ammeter 180. In some embodiments, the battery defect screener 160 may calculate the storage capacity change value (dQ) based on the storage capacity (Q). In some embodiments, the storage capacity change value (dQ) may be calculated by the storage capacity calculator 168 to then be transmitted to the differential voltage calculator 169, or may be calculated by the differential voltage calculator 169.

In addition, if a voltage change value/storage capacity change value (dV/dQ) is less than 0, the battery defect screener 160 may determine the battery to be a defective battery having a hard short due to the foreign material 109, and, if not, may determine the battery to be a normal battery, to then perform the next operation (e.g., the first charging operation (S3) or the second discharging operation (S4)). Here, the voltage change value (dV) and the storage capacity change value (dQ) may be change values per hour, respectively.

As described above, according to some embodiments of the present disclosure, when a hard short is generated in the secondary battery 101 during a defect screening operation of the secondary battery 101, the defect screening operation is quickly or immediately stopped, thereby eliminating a defective battery from the battery fixer 110. In actuality, a fire may occur to the secondary battery 101 due to the hard short.

Meanwhile, after the second charging operation (S8), during the initial voltage measuring operation (S9), the battery defect screener 160 may measure the initial voltage value (V0) of the secondary battery 101 by means of the voltmeter 140. In some embodiments, the battery defect screener 160 may measure the initial voltage value of the secondary battery 101, and a rest time may then occur. In some embodiments, the rest time may be about 8 hours to about 12 hours. In some embodiments, the rest time may mean a time in which a charging or discharging operation is stopped.

In the first voltage value measuring operation (S10), the battery defect screener 160 may measure the first voltage value (V1) of the secondary battery 101 after the lapse of a first time period by means of the voltmeter 140. In some embodiments, the first time period may be about 1 hour to about 2 hours.

In the first normal/defective battery determining operations (S11, S12, and S13), the battery defect screener 160 may determine the battery to be a normal battery without the foreign material 109 when a first voltage change value (dV=V0−V1), which may be obtained by subtracting the first voltage value from the initial voltage value, is less than a first reference value, and may determine the battery to be a defective battery having a hard short due to the foreign material 109 when the first voltage change value, which may be obtained by subtracting the first voltage value from the initial voltage value, is greater than the first reference value. In some embodiments, the first reference value may be set to be about 100 mV to about 165 mV.

In the second voltage measuring operation (S14), the battery defect screener 160 may measure a second voltage value (V2) of the secondary battery 101 (e.g., after the lapse of a second time period) by means of the voltmeter 140. In some embodiments, the second time period may be about 8 hours to about 12 hours.

In the second normal/defective battery determining operations (S15, S16 and S17), the battery defect screener 160 may determine the battery to be a normal battery without the foreign material 109 when a second first voltage change value (dV=V0−V2), which is obtained by subtracting the second voltage value from the initial voltage value, is less than a second reference value, and may determine the battery to be a defective battery having a soft short due to the foreign material 109 when the second voltage change value obtained by subtracting the second voltage value from the initial voltage value is greater than a second reference value. In some embodiments, the second reference value may be set to about 50 mV to about 70 mV.

As described above, according to embodiments of the present disclosure, the secondary battery 101 is screened through three operations whether a defect has occurred therein. In some embodiments, while charging and discharging of the secondary battery 101 are repeated, the secondary battery 101 is screened using the differential voltage (dV/dQ) to determine whether a hard short defect has occurred therein; the secondary battery 101 is screened using a first voltage change value whether a hard short defect has occurred therein, the first voltage change value being obtained by subtracting a first voltage value from an initial voltage value of the secondary battery 101; and the secondary battery 101 is screened using a second voltage change value to determine whether a soft short defect has occurred therein, the second voltage change value obtained by subtracting a second voltage value from the initial voltage value of the secondary battery 101. Therefore, according to embodiments of the present disclosure, it is possible to more accurately screen whether a defect has occurred in the secondary battery 101. In some embodiments, electrical resistance of an electrode assembly is measured in a state in

| Description of reference numerals | |
| --- | --- |
| 100: Battery defect screening device | |
| 101: Secondary battery | 102: Electrode assembly |
| 102a: Separator | 102b: Positive electrode plate |
| 102c: Negative electrode plate | 103: Positive electrode terminal |
| 104: Negative electrode terminal | 105: Insulation sheet |
| 106: Enclosing tape | 108: Case |
| 109: Foreign material | 110: Battery fixer |
| 111: Bottom plate | 112: Top plate |
| 113: Side plate | 120: Discharger |
| 130: Charger | 140: Voltmeter |
| 150: Timer | 160: Battery defect screener |
| 161: CPU | 162: RAM |
| 163: ROM | 164: Voltage input unit |
| 165: Voltage change calculator | 166: Defect determiner |
| 167: Current input unit | 168: Storage capacity calculator |
| 169: Differential voltage calculator | 170: Display |
| 180: Ammeter | |

What is claimed is:

1. A battery defect screening device comprising:
   a battery fixer for fixing a secondary battery;
   a discharger for discharging the secondary battery;
   a charger for charging the secondary battery;
   a voltmeter for measuring an initial voltage value after charging the secondary battery, for measuring a first voltage value after a first time period, and for measuring a second voltage value after a second time period; and
   a defect screener for:
      determining the secondary battery to be a normal battery that is without a foreign material when a first voltage change value, which is obtained by subtracting the first voltage value from the initial voltage value, is less than a first reference value;
      determining the secondary battery to be a defective battery having a hard short due to the foreign material when the first voltage change value is greater than the first reference value;
      determining the secondary battery to be the normal battery that is without the foreign material when a second voltage change value, which is obtained by subtracting the second voltage value from the initial voltage value, is less than a second reference value; and
      determining the secondary battery to be a defective battery having a soft short due to the foreign material when the second voltage change value is greater than the second reference value.

2. The battery defect screening device of claim 1, further comprising an ammeter for measuring a current of the secondary battery,
   wherein, before measuring the initial voltage value of the secondary battery after charging the secondary battery, the defect screener is configured to:
      repeatedly charge and discharge the secondary battery by means of the charger and the discharger;
      calculate a voltage change value (dV) using a voltage value input from the voltmeter;
      calculate a storage capacity (Q) using a current value input from the ammeter;
      calculate a storage capacity change value (dQ) based on the storage capacity (Q); and
      determine the secondary battery to be the defective battery having the hard short due to the foreign material when the voltage change value divided by the storage capacity change value (dV/dQ) is less than 0.

3. The battery defect screening device of claim 2, wherein the secondary battery is determined to be the normal battery when the voltage change value divided by the storage capacity change value (dV/dQ) is greater than 0.

4. The battery defect screening device of claim 1, wherein the battery fixer is configured to fix exterior sides of the secondary battery so as to reduce or prevent change of an outer thickness of the secondary battery due to charging or discharging of the secondary battery.

5. The battery defect screening device of claim 1, wherein the discharger is configured to discharge the secondary battery to a voltage that is lower than a full discharge voltage of the secondary battery.

6. The battery defect screening device of claim 1, wherein the charger is configured to charge the secondary battery to a voltage that is higher than a full charge voltage set to the secondary battery.

7. The battery defect screening device of claim 1, wherein the second time period is longer than the first time period.

8. The battery defect screening device of claim 1, wherein the charger and the discharger are configured to have a rest time after the initial voltage value of the secondary battery is measured.

9. The battery defect screening device of claim 1, wherein the second reference value is less than the first reference value.

10. The battery defect screening device of claim 1, further comprising a display configured to indicate the normal battery, the defective battery having the hard short, or the defective battery having the soft short.

11. A battery defect screening method comprising:
    fixing a secondary battery;
    discharging the secondary battery;
    charging the secondary battery;
    measuring an initial voltage value after charging the secondary battery;
    measuring a first voltage value after a first time period;
    measuring a second voltage value after a second time period; and
    determining the secondary battery to be:
       a normal battery without a foreign material when a first voltage change value, which is obtained by subtracting the first voltage value from the initial voltage value, is less than a first reference value;
       a defective battery having a hard short due to the foreign material when a second voltage change value, which is obtained by subtracting the second voltage value from the initial voltage value, is greater than a second reference value; or a defective battery having a soft short due to the foreign material when the second voltage change value is greater than the second reference value.

12. The battery defect screening method of claim 11, further comprising:
    performing a current measurement operation of measuring a current of the secondary battery;
    repeatedly charging and discharging the secondary battery;
    calculating a voltage change value (dV) using voltage values input from a voltmeter;
    calculating a storage capacity (Q) using a current value input from an ammeter;
    calculating a storage capacity change value (dQ) based on the storage capacity (Q); and
    determining the secondary battery to be a defective battery when the voltage change value divided by the storage capacity change value (dV/dQ) is less than 0.

13. The battery defect screening method of claim 12, further comprising determining the secondary battery to be the normal battery when the voltage change value divided by the storage capacity change value (dV/dQ) is greater than 0.

14. The battery defect screening method of claim 11, wherein fixing the secondary battery comprises fixing exterior sides of the secondary battery so as to reduce or prevent change of an outer thickness of the secondary battery during charging or discharging of the secondary battery.

15. The battery defect screening method of claim 11, wherein discharging the secondary battery comprises discharging the secondary battery to a voltage that is lower than a full discharge voltage of the secondary battery.

16. The battery defect screening method of claim 11, wherein charging the secondary battery comprises charging the secondary battery to a voltage that is higher than a full charge voltage of the secondary battery.

17. The battery defect screening method of claim 11, wherein the second time period is longer than the first time period.

18. The battery defect screening method of claim 11, further comprising providing a rest time after measuring the initial voltage value of the secondary battery.

19. The battery defect screening method of claim 11, wherein the second reference value is less than the first reference value.

20. The battery defect screening method of claim 11, further comprising indicating on a display the normal battery, the defective battery having the hard short, or the defective battery having the soft short.

* * * * *